(12) United States Patent
Wiegman et al.

(10) Patent No.: US 9,465,080 B2
(45) Date of Patent: Oct. 11, 2016

(54) SYSTEM AND METHOD FOR PROGNOSIS OF BATTERIES

(71) Applicant: General Electric Company, Schenectady, NY (US)

(72) Inventors: Herman Lucas Norbert Wiegman, Niskayuna, NY (US); David Eugene James, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 799 days.

(21) Appl. No.: 13/727,019

(22) Filed: Dec. 26, 2012

(65) Prior Publication Data
US 2014/0176147 A1     Jun. 26, 2014

(51) Int. Cl.
*G01R 19/14*     (2006.01)
*G01R 31/36*     (2006.01)

(52) U.S. Cl.
CPC ....... *G01R 31/3624* (2013.01); *G01R 31/3606* (2013.01); *G01R 31/3665* (2013.01)

(58) Field of Classification Search
CPC ........................... G01R 31/3624; G01R 19/14
USPC ........................................ 324/434, 433, 302
See application file for complete search history.

(56) References Cited

U.S. PATENT DOCUMENTS

| 5,206,578 | A * | 4/1993 | Nor .............................. | 320/118 |
| 5,351,010 | A * | 9/1994 | Leopold et al. .............. | 324/704 |
| 5,633,573 | A * | 5/1997 | van Phuoc et al. .......... | 320/128 |
| 6,611,774 | B1 * | 8/2003 | Zaccaria ........................ | 702/63 |
| 7,688,033 | B2 * | 3/2010 | Minamiura .................... | 320/134 |
| 2002/0145430 | A1 * | 10/2002 | Arai et al. ..................... | 324/426 |
| 2006/0202857 | A1 * | 9/2006 | Kawahara et al. ...... | 340/870.02 |
| 2013/0088201 | A1 * | 4/2013 | Iwasawa et al. .............. | 320/118 |
| 2014/0028321 | A1 * | 1/2014 | Bourgeois ..................... | 324/427 |

* cited by examiner

*Primary Examiner* — Drew A Dunn
*Assistant Examiner* — Jerry D Robbins
(74) *Attorney, Agent, or Firm* — Francis T. Coppa

(57) ABSTRACT

In accordance with one aspect of the present technique, a method is disclosed. The method includes identifying a first change in an excitation direction of a group of cells and determining a first set of characteristics of the group of cells corresponding to the first change. The method also includes identifying a second change in the excitation direction of the group of cells and determining a second set of characteristics of the group of cells corresponding to the second change. The second change in the excitation direction is opposite to the first change in the excitation direction. The method further includes determining a number of functional cells from the group of cells based on the first and the second set of characteristics.

14 Claims, 4 Drawing Sheets

SYSTEM AND METHOD FOR PROGNOSIS OF BATTERIES

BACKGROUND

The subject matter disclosed herein generally relates to prognosis of batteries. More specifically, the subject matter relates to systems and methods for prognosis of batteries by determining a number of functional cells in the battery.

A battery is a device including one or more electrochemical cells that convert chemical energy into electrical energy. Many of the electronic systems for example, healthcare devices, electric vehicles, computer data centers, home appliances, or the like, operate using the electrical energy provided by such batteries. Batteries fail due to a variety of factors such as improper cell design, aging, severe operating conditions, hostile environments, or the like. Such battery failures are often unexpected and hence reduce the productivity and profitability of the load, i.e., the electronic systems coupled to the battery.

Existing methods of battery prognosis have numerous problems. For example, such methods include invasive techniques for electrical measurements that require the battery to be disconnected from the load. Furthermore, these methods are often inaccurate as they are prone to noise resulting from the behavior of the batteries.

Thus, there is a need for an enhanced system and method for prognosis of batteries.

BRIEF DESCRIPTION

In accordance with one aspect of the present technique, a method is disclosed. The method includes identifying a first change in an excitation direction of a group of cells and determining a first set of characteristics of the group of cells corresponding to the first change. The method also includes identifying a second change in the excitation direction of the group of cells, wherein the second change in the excitation direction is opposite to the first change in the excitation direction and determining a second set of characteristics of the group of cells corresponding to the second change. The method further includes determining a number of functional cells from the group of cells based on the first and the second set of characteristics.

In accordance with one aspect of the present systems, a system is disclosed. The system includes a direction module for identifying a first change in an excitation direction of a group of cells, determining a first set of characteristics of the group of cells corresponding to the first change, identifying a second change in the excitation direction of the group of cells and determining a second set of characteristics of the group of cells corresponding to the second change, wherein the second change in the excitation direction is opposite to the first change in the excitation direction. The system also includes a determination module for determining a number of functional cells from the group of cells based on the first and the second set of characteristics.

In accordance with one aspect of the present technique, a computer program product encoding instructions for identifying a first change in an excitation direction of a group of cells and determining a first set of characteristics of the group of cells corresponding to the first change. The method also includes identifying a second change in the excitation direction of the group of cells, wherein the second change in the excitation direction is opposite to the first change in the excitation direction and determining a second set of characteristics of the group of cells corresponding to the second change. The method further includes determining a number of functional cells from the group of cells based on the first and the second set of characteristics.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
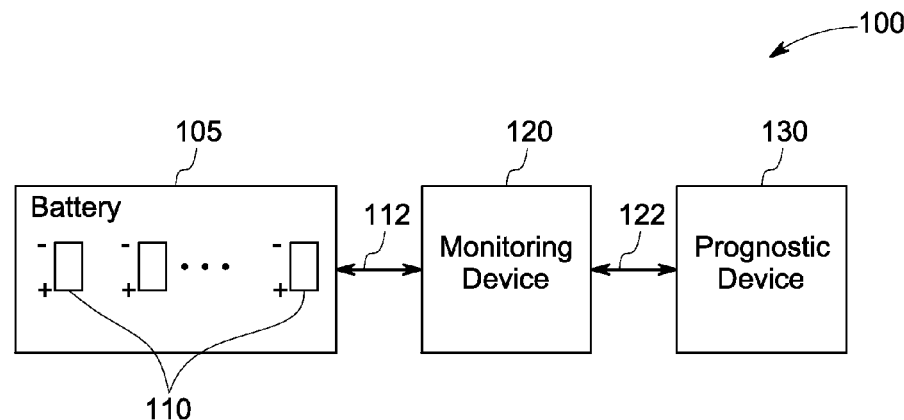
FIG. 1 is a block diagram illustrating a system for prognosis of a battery according to one embodiment.

A system and method for prognosis of batteries is described. FIG. 1 illustrates a block diagram of a system 100 for prognosis of a battery according to one embodiment. The illustrated system 100 includes a battery 105, a monitoring device 120, and a prognostic device 130. In the illustrated embodiment, the battery 105 is communicatively coupled to the monitoring device 120 via signal line 112. Similarly, the prognostic device 130 is communicatively coupled to the monitoring device 120 via signal line 122. Although, one battery 105, one monitoring device 120 and one prognostic device 130 are illustrated in FIG. 1, in other embodiments, any number of batteries 105, monitoring devices 120, and prognostic devices 130 can be communicatively coupled with each other. Although in the illustrated embodiment, the battery 105, the monitoring device 120 and the prognostic device 130 are communicatively coupled via signal lines 112 and 122, in other embodiments, the devices can be communicatively coupled wirelessly via a network (not pictured). In such embodiments, the system 100 may further include transceivers, centralized servers, cloud storage or the like, for communicating information.

The battery 105 is any type of energy storage device that includes one or more cells 110. In this example, the cells 110 are bidirectional electrochemical devices that are configured to convert chemical energy into electrical energy. For example, the cells 110 include a cathode (not pictured) and an anode (not pictured) disposed in an electrolyte (not pictured). The cathode and anode undergo a chemical reaction to generate an electromotive force (i.e., open circuit voltage) that causes a flow of electrons (i.e., electricity) between the cathode and the anode. The process of converting chemical energy into electrical energy is referred to as the discharge cycle of the battery 105. The cells 110 are also configured to convert electrical energy into chemical energy. For example, the cells 110 are supplied with electricity to reverse the chemical reaction between the cathode and the anode. The process of converting electrical energy into chemical energy is referred to as the recharge cycle of the battery 105.

In one embodiment, the cells 110 of the battery 105 are coupled to each other in a series configuration. In other embodiments, the cells 110 can also be coupled in any configuration, for example, a parallel configuration, a combination of series and parallel configurations, or the like. In one embodiment, the cells 110 of the battery 105 are coupled to each other in a string configuration. In such an embodiment, the battery 105 includes one or more groups of cells (i.e., strings of cells). The cells 110 within each of the groups can be coupled to each other in any of the configurations (for example, series, combination of series and parallel or the like) mentioned herein.

In one embodiment, the battery 105 is a molten salt battery (e.g., sodium-metal halide batteries) having cells 110 that include molten salts as the electrolyte. In such an embodiment, the battery 105 is operated based on a first-in, first-out reaction (FIFO) principle in which all the cells 110 of the battery 105 (or a group in string configuration) are either in the discharge cycle or the recharge cycle (i.e., the same excitation direction) simultaneously. When the battery 105 is operated based on the FIFO reaction principle, the reaction resistance of each cell 110 monotonically increases with either the depth of discharge or the state of recharge. Additionally, the reaction resistance of each cell 110 decreases to a low level (i.e., an offset level) when the battery 105 transitions from the discharge cycle to the recharge cycle or vice versa. The offset level is the minimum resistance of a cell 110 that exists (i.e., cannot be eliminated) to the flow of electrons in the cell 110.

The cells 110 of the battery 105 may fail due to a variety of factors such as improper cell design, severe operating conditions (e.g., high external temperature, pressure, etc.), aging, or the like. In one embodiment, a failed cell is an electrically shorted cell that fails to generate the electromotive force i.e., the failed cell has a low resistance short with no remaining open circuit voltage. The cells 110 in the battery 105 that are healthy and working (i.e., the cells 110 that have not failed) may be referred to as the functional cells of the battery 105.

The monitoring device 120 is any sensor or device configured for measuring the characteristics of the battery 105. The characteristics include, for example, terminal current, terminal voltage, temperature, or the like. In one embodiment, the monitoring device 120 includes an ammeter for measuring the terminal current of the battery 105. In another embodiment, the monitoring device 120 includes a voltmeter for measuring the terminal voltage of the battery 105. In yet another embodiment, the monitoring device 120 includes a thermocouple for measuring the temperature of the battery 105. In yet another embodiment, the monitoring device 120 also calculates the state of charge of the battery 105 based on the measured characteristics, for example, the terminal current.

The monitoring device 120 is further configured to communicate the battery characteristics (including the calculated state of charge) to the prognostic device 130. In another embodiment where the battery 105 includes a string configuration, the monitoring device 120 is configured to measure the characteristics (for example, terminal voltage, terminal current or the like) for each group of cells (i.e., strings), calculate the state of charge and communicate them to the prognostic device 130.

The prognostic device 130 is used for prognosis of the battery 105. The prognostic device 130 is configured to receive one or more signals representative of the battery characteristics from the monitoring device 120 and determine the number of functional cells in the battery 105. The prognostic device 130 is described below in more detail with reference to FIG. 2. Although, the prognostic device 130 is described herein with reference to determining a number of functional cells in the battery 105, in one embodiment where the battery includes a string configuration, the prognostic device 130 may be configured to determine the number of functional cells from each group (i.e., strings) of cells included in the battery 105.

Figure 2:
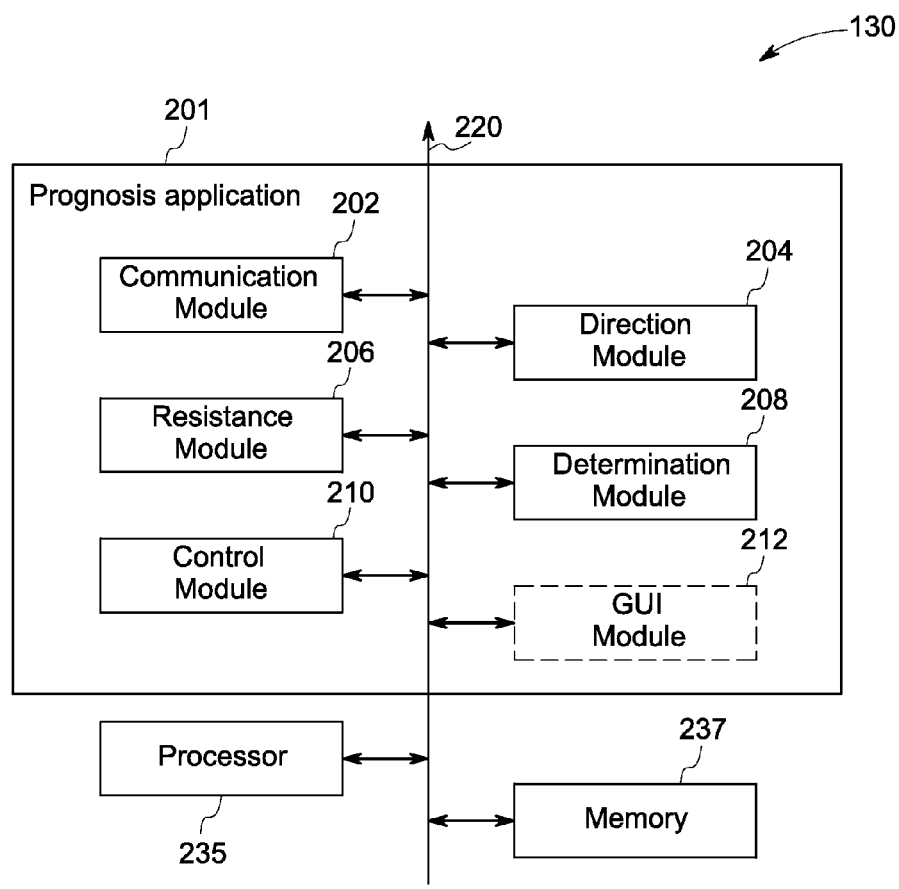
FIG. 2 is a block diagram illustrating a prognostic device according to one embodiment.

FIG. 2 is a block diagram illustrating the prognostic device 130 according to one embodiment. The prognostic device 130 includes a prognosis application 201, a processor 235, and a memory 237. The prognosis application 201 includes a communication module 202, a direction module 204, a resistance module 206, a determination module 208, and a control module 210. In a further embodiment, the prognosis application 201 optionally includes a graphical user interface (GUI) module 212. The modules of the prognosis application 201, the processor 235, and the memory 237 are coupled to a bus 220 for communication with one another. As used herein, a module can refer to software elements, hardware elements or a combination of hardware and software elements.

The processor 235 may include an arithmetic logic unit, a microprocessor, a general purpose controller or other processor arrays to perform computations, retrieve data stored on the memory 237. In another embodiment, the processor is a multiple core processor. The processor 235 processes data signals and may include various computing architectures including a complex instruction set computer (CISC) architecture, a reduced instruction set computer (RISC) architecture, or an architecture implementing a combination of instruction sets. The processing capability of the processor 235 may be limited to supporting the retrieval of data and transmission of data. The processing capability of the processor 235 may also perform more complex tasks, including various types of modulating, encoding, and multiplexing. In other embodiments, other processors, operating systems, and physical configurations are possible.

The memory 237 may be a non-transitory storage medium. For example, the memory 237 may be a dynamic random access memory (DRAM) device, a static random access memory (SRAM) device, flash memory or other memory devices. In one embodiment, the memory 237 also includes a non-volatile memory or similar permanent storage device, and media such as a hard disk drive, a floppy disk drive, a compact disc read only memory (CD-ROM) device, a digital versatile disc read only memory (DVD-ROM) device, a digital versatile disc random access memories (DVD-RAM) device, a digital versatile disc rewritable (DVD-RW) device, a flash memory device, or other non-volatile storage devices.

The memory 237 stores data that is required for the prognosis application 201 to perform associated functions. In one embodiment, the memory 237 stores the modules (for example, the communication module 202, determination module 208 or the like) of the prognosis application 201. In another embodiment, the memory 237 stores the characteristics received from the monitoring device. In yet another embodiment, the memory 237 may store battery description data that are provided by, for example, a manufacturer/vendor of the battery, an administrator of the prognostic device, or the like. The battery description data may include the initial number of cells ($N_{I\text{-}cells}$) in the battery, the open circuit voltage of each cell ($V_{C\text{-}OC}$) in the battery, the coupling configuration (for example, series, parallel, string, or the like) of the cells in the battery, a resistance threshold value, fault threshold value, or the like.

The communication module 202 includes code and routines for handling communication between the monitoring device and the prognostic device. In one embodiment, the communication module 202 includes a set of instructions executable by the processor 235 to provide the functionality for handling communication between the monitoring device and the prognostic device. In another embodiment, the communication module 202 is stored in the memory 237 and is accessible and executable by the processor 235. In either embodiment, the communication module 202 is adapted for communication and cooperation with the processor 235 and other components of the prognosis application 201 via the bus 220.

In one embodiment, the communication module 202 receives the characteristics (for example, terminal current, terminal voltage, temperature, or the like) from the monitoring device at regular time intervals (for example, every 0.5 milliseconds, 5 seconds, 2 minutes, or the like). In another embodiment, the communication module 202 sends a request to the monitoring device. In such an embodiment, the communication module 202 receives the characteristics from the monitoring device in response to the request. In either embodiment, the communication module 202 delivers the received characteristics to the direction module 204.

The direction module 204 includes code and routines for identifying a change in an excitation direction of the battery. In one embodiment, the direction module 204 includes a set of instructions executable by the processor 235 to provide the functionality for identifying a change in the excitation direction of the battery. In another embodiment, the direction module 204 is stored in the memory 237 and is accessible and executable by the processor 235. In either embodiment, the direction module 204 is adapted for communication and cooperation with the processor 235 and other components of the prognosis application 201 via the bus 220.

The direction module 204 receives the battery characteristics from the communication module 202. The direction module 204 determines the excitation direction of the battery (i.e., whether the battery is in the discharge cycle or in the recharge cycle) based on the received battery characteristics. The excitation direction of the battery in the discharge cycle is opposite to the excitation direction of the battery in the recharge cycle.

In one embodiment, the direction module 204 determines the excitation direction based on the terminal current included in the received battery characteristics. The direction module 204 infers that the battery is in the discharge cycle if the terminal current is positive. The direction module 204 infers that the battery is in the recharge cycle if the terminal current is negative. Similarly, in another embodiment, the direction module 204 determines the excitation direction of the battery based on the terminal voltage included in the received battery characteristics. Although, the description herein describes that the direction module 204 infers that the battery is in discharge cycle if the terminal current/voltage is positive, in one embodiment, the direction module 204 may infer that the battery is in discharge cycle if the terminal current/voltage is negative.

The direction module 204 identifies a change in the excitation direction by determining when the battery transitions from the discharge cycle to the recharge cycle and vice versa. The direction module 204 then transmits a notification to the resistance module 206 and the determination module 208 in response to identifying the change in the excitation direction.

In one embodiment, the direction module 204 identifies a change in excitation direction by determining that the battery transitioned from the recharge cycle to the discharge cycle. The direction module 204 then stores the terminal voltage and current (i.e., battery characteristics) received during the time of transition as the discharge voltage and current (i.e., discharge characteristics) respectively. The direction module 204 also identifies a change in excitation direction by determining that the battery transitioned from the discharge cycle to the recharge cycle. The direction module 204 then stores the terminal voltage and current (i.e., battery characteristics) received during the time of transition as the recharge voltage and current (i.e., recharge characteristics) respectively. The direction module 204 stores the discharge characteristics and the recharge characteristics in the memory 237.

Figure 3:
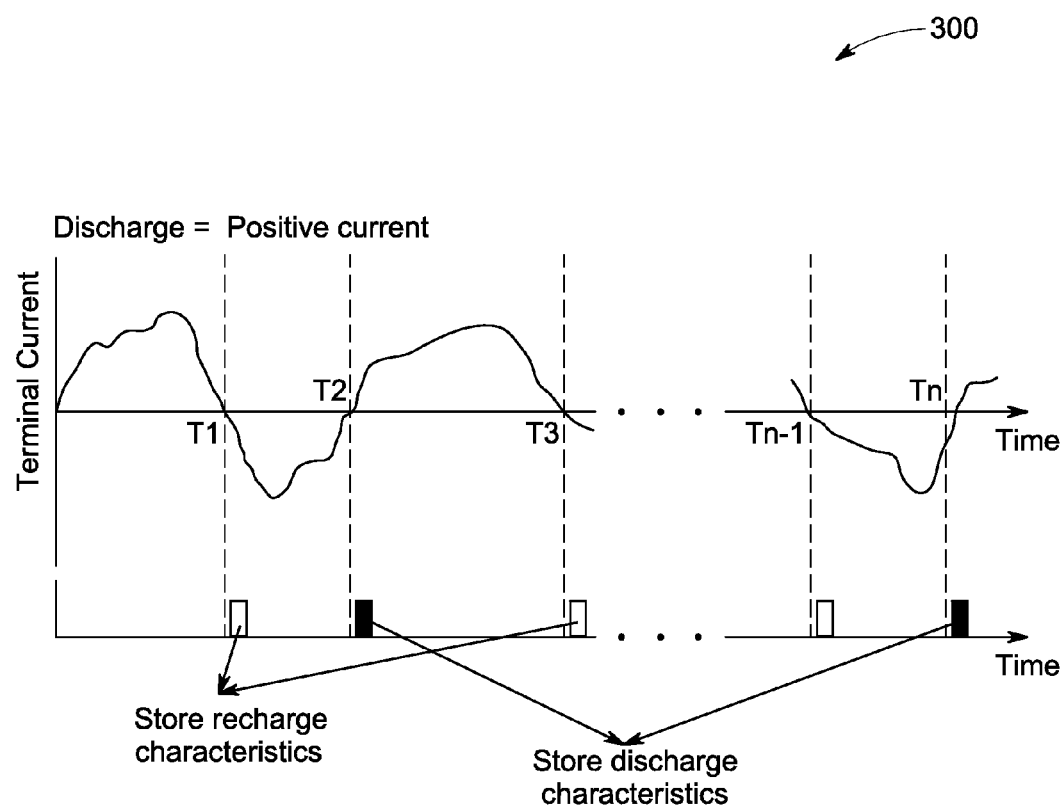
FIG. 3 is a graph depicting the identification of changes in the excitation direction of the battery according to one embodiment.

Referring now to FIG. 3, a graph depicting the identification of changes in the excitation direction of the battery is illustrated. In the illustrated graph, the x-axis is represented by time and the y-axis is represented by the amplitude of the terminal current of the battery. The direction module determines that at time T1, the terminal current changes to negative from positive. Thus, the direction module identifies a change in the excitation direction of the battery. The direction module then stores the battery characteristics at time T1 as the recharge characteristics in the memory. The direction module also sends a notification to the resistance module and the determination module.

The direction module then determines that at time T2, the terminal current changes to positive from negative. Thus, the direction module identifies another change in the excitation direction (i.e., opposite to the change in excitation direction at time T1) of the battery. The direction module stores the received battery characteristics at time T2 as the discharge characteristics in the memory. The direction module also sends a notification to the resistance module and the determination module. Similarly, the direction module identifies the changes in the excitation direction at time T3, Tn−1, Tn, or the like and stores the corresponding recharge and discharge characteristics in the memory.

Now, referring back to FIG. 2, the resistance module 206 includes code and routines for calculating a discharge resistance and a recharge resistance of the battery. In one embodiment, the resistance module 206 includes a set of instructions executable by the processor 235 to provide the functionality for calculating the discharge resistance and the recharge resistance of the battery. In another embodiment, the resistance module 206 is stored in the memory 237 and is accessible and executable by the processor 235. In either embodiment, the resistance module 206 is adapted for communication and cooperation with the processor 235 and other components of the prognosis application 201 via the bus 220.

The resistance module 206 receives a notification indicating a change in the excitation direction of the battery from the direction module 204. In one embodiment, the notification indicates that the battery transitioned from the recharge cycle to the discharge cycle. The resistance module 206 then retrieves the stored discharge characteristics from the memory 237 and calculates the discharge resistance of the battery. The resistance module 206 calculates the discharge resistance based on the equation:

$$R_D = \frac{V_{B,OC} - V_D}{I_D} \quad (1)$$

Where:
$R_D$ is the discharge resistance;
$V_{B.OC}$ is the open circuit voltage of the battery;
$V_D$ is the discharge voltage; and
$I_D$ is the discharge current.

In equation (1), the resistance module 206 determines the open circuit voltage of the battery ($V_{B.OC}$) based on the initial number of cells ($N_{I\text{-}cells}$) in the battery and the open circuit voltage of each cell ($V_{C.OC}$). For example, the resistance module 206 determines the open circuit voltage of the battery ($V_{B.OC}$) by multiplying initial number of cells ($N_{I\text{-}cells}$) with the open circuit voltage of each cell ($V_{C.OC}$). In another example, the open circuit voltage of the battery ($V_{B.OC}$) is a summation of the open circuit voltage of each cell ($V_{C.OC}$). The resistance module 206 retrieves the initial number of cells ($N_{I\text{-}cells}$) and the open circuit voltage of each cell ($V_{C.OC}$) from the battery descriptions stored in the memory 237. In one embodiment, the resistance module 206 retrieves a pre-calculated open circuit voltage of the battery ($V_{B.OC}$) from the memory 237.

The resistance module 206 also receives a notification indicating that the battery transitioned from the discharge cycle to the recharge cycle. The resistance module 206 then retrieves the stored recharge characteristics from the memory 237 and calculates the recharge resistance of the battery. The resistance module 206 calculates the recharge resistance based on the equation:

$$R_R = \frac{V_{B.OC} - V_R}{I_R} \quad (2)$$

Where:
$R_R$ is the recharge resistance;
$V_{B.OC}$ is the open circuit voltage of the battery;
$V_R$ is the recharge voltage; and
$I_R$ is the recharge current.

The resistance module 206 sends the calculated discharge resistance and recharge resistance to the determination module 208.

The determination module 208 includes code and routines for determining a number of functional cells in the battery. In one embodiment, the determination module 208 includes a set of instructions executable by the processor 235 to provide the functionality for determining the number of functional cells in the battery. In another embodiment, the determination module 208 is stored in the memory 237 and is accessible and executable by the processor 235. In either embodiment, the determination module 208 is adapted for communication and cooperation with the processor 235 and other components of the prognosis application 201 via the bus 220.

The determination module 208 receives notifications indicating changes in the excitation direction of the battery. The determination module 208 determines the number of functional cells in response to receiving two consecutive notifications from the direction module 204. The determination module 208 infers that the battery has undergone a full cycle of discharging and recharging (or vice versa) in response to receiving two consecutive notifications.

In one embodiment, the determination module 208 determines the number of functional cells based on the discharge and the recharge characteristics that correspond to the two notifications received from the direction module 204. For example, if the determination module 208 receives a first notification at time T1 (refer FIG. 3) and a second notification at time T2 (refer FIG. 3), the determination module 208 determines the number of functional cells based on the recharge and discharge characteristics stored at time T1 and time T2 respectively. The determination module 208 retrieves the recharge and discharge characteristics from the memory 237. In this embodiment, the determination module 208 determines the number of functional cells based on the equation:

$$N_{F\text{-}cells} = \frac{1}{V_{C.OC}} \cdot \frac{V_R I_D - V_D I_R}{I_D - I_R} \quad (3)$$

or $$N_{F\text{-}cells} = \frac{1}{V_{C.OC}} \cdot \frac{V_D I_R - V_R I_D}{I_R - I_D} \quad (4)$$

Where:
$N_{F\text{-}cells}$ is the number of functional cells in the battery;
$V_{C.OC}$ is the open circuit voltage of a cell in the battery;
$V_R$ is the recharge voltage;
$I_R$ is the recharge current;
$V_D$ is the discharge voltage; and
$I_D$ is the discharge current.

In another embodiment, the determination module 208 determines the number of functional cells based on the equation:

$$N_{F\text{-}cells} = \frac{V_R I_D - V_D I_R}{V_{C.OC.R} I_D - V_{C.OC.D} I_R} \quad (5)$$

or $$N_{F\text{-}cells} = \frac{V_D I_R - V_R I_D}{V_{C.OC.D} I_R - V_{C.OC.R} I_D} \quad (6)$$

Where:
$N_{F\text{-}cells}$ is the number of functional cells in the battery;
$V_{C.OC.R}$ is the open circuit voltage of a cell in the battery in recharge cycle;
$V_R$ is the recharge voltage;
$I_R$ is the recharge current;
$V_{C.OC.D}$ is the open circuit voltage of a cell in the battery in discharge cycle;
$V_D$ is the discharge voltage; and
$I_D$ is the discharge current In such an embodiment, the determination module 208 calculates the open circuit voltage of a cell during each recharge cycle ($V_{C.OC.R}$) and discharge cycle ($V_{C.OC.D}$) based on the state of charge (SOC) of the battery. For example, the determination module 208 determines the open circuit voltage based on the equation:

$$V_{C.OC} = \begin{cases} \text{if } (96 \geq SOC \geq 40)\text{: } 2.58\ V \\ \text{if } (35 \geq SOC \geq 25)\text{: } 2.35\ V \\ \text{else: } 0V(\text{non-estimate}) \end{cases} \quad (7)$$

In the above example, if the calculated open circuit voltage ($V_{C.OC.R}/V_{C.OC.D}$) of the cell is zero, the determination module 206 discards it and determines the open circuit voltage ($V_{C.OC.R}/V_{C.OC.D}$) in the following cycle of recharge/discharge. Although the calculation of the open circuit voltage ($V_{C.OC.R}/V_{C.OC.D}$) is described according to one example (i.e., equation 7), in other examples, equation 7 can be modified based on the battery chemistries, measured temperature or the like.

In either of the above embodiments, the determination module 208 compares the determined number of functional cells ($N_{F\text{-}cells}$) with the initial number of cells ($N_{I\text{-}cells}$) cells in the battery. The determination module 208 retrieves the initial number of cells ($N_{I\text{-}cells}$) from the memory 237. The determination module 208 determines a failure in the battery if the determined number of functional cells ($N_{F\text{-}cells}$) is lesser than the initial number of cells ($N_{I\text{-}cells}$). The determination module 208, in response to determining the failure, sends a message including the determined number of functional cells ($N_{F\text{-}cells}$) to the control module 210.

In yet another embodiment, the determination module 208 determines the number of functional cells ($N_{F\text{-}cells}$) based on the discharge resistance and the recharge resistance corresponding to the two notifications received from the direction module 204. In such an embodiment, the determination module 208 determines the difference between the discharge resistance and the recharge resistance. The determination module 208 determines a failure in the battery if the difference exceeds a resistance threshold value. The determination module 208 retrieves the resistance threshold value from the memory 237. The resistance threshold value is provided by, for example, an administrator of the prognostic device. The determination module 208 then determines the number of functional cells ($N_{F\text{-}cells}$) based on equation (3) or (4). The determination module 208 also communicates a message including the number of functional cells ($N_{F\text{-}cells}$) to the control module 210.

The control module 210 includes code and routines for modifying the initial number of cells ($N_{I\text{-}cells}$) stored in the memory 237 and determining whether the battery is in fault state. In one embodiment, the control module 210 includes a set of instructions executable by the processor 235 to provide the functionality for modifying the initial number of cells ($N_{I\text{-}cells}$) stored in the memory 237 and determining whether the battery is in fault state. In another embodiment, the control module 210 is stored in the memory 237 and is accessible and executable by the processor 235. In either embodiment, the control module 210 is adapted for communication and cooperation with the processor 235 and other components of the prognosis application 201 via the bus 220.

The control module 210 obtains a message from the determination module 208 indicating a failure in the battery. The message also includes the determined number of functional cells ($N_{F\text{-}cells}$) in the battery. In one embodiment, the control module 210 modifies (i.e., replaces) the initial number of cells ($N_{I\text{-}cells}$) stored in the memory 237 with the determined number of functional cells ($N_{F\text{-}cells}$).

In another embodiment, the control module 210 modifies the initial number of cells ($N_{I\text{-}cells}$) such that the difference calculated by the resistance module 206 in the next cycle of discharging and recharging is reduced to less than or equal to the resistance threshold value. In yet another embodiment, the control module 210 modifies the initial number of cells ($N_{I\text{-}cells}$) based on the number of times the message is received indicating the battery failure. For example, the control module 210 modifies the initial number of cells ($N_{I\text{-}cells}$), in response to receiving the message for three consecutive cycles of recharging and discharging. In such an example, the control module 210 does not modify the initial number of cells ($N_{I\text{-}cells}$) if the message is received for only one cycle. In such an embodiment, the number of cycles is provided by for example, an administrator of the prognostic device and is stored in the memory 237. This is advantageous, as it prevents the control module 210 from modifying the initial number of cells ($N_{I\text{-}cells}$) due to, for example, erroneous measurements of the battery characteristics by the monitoring device 120. In yet another embodiment, prior to modifying the initial number of cells ($N_{I\text{-}cells}$), the control module 210 applies low pass filtering techniques to the determined number of functional cells ($N_{F\text{-}cells}$) to reduce the effects of noise.

In one embodiment, in response to receiving the message from the determination module 208, the control module 210 determines whether the battery is in a fault state. In such an embodiment, the control module 210 determines a number of non-functional cells ($N_{N\text{-}cells}$), i.e., failed cells in the battery by calculating the difference between the number of functional cells ($N_{F\text{-}cells}$) and the initial number of cells ($N_{I\text{-}cells}$) in the battery. The control module 210 then compares the number of non-functional cells ($N_{N\text{-}cells}$) with a fault threshold value. The control module 210 may retrieve the fault threshold value from the memory 237. The control module 210 infers that the battery is in fault state if the number of non-functional cells ($N_{N\text{-}cells}$) exceeds the fault threshold value.

In one embodiment, in response to determining that the battery is in fault state, the control module 210 disconnects the battery. For example, the control module 210 disconnects/switches off the battery from the load. In another example, the control module 210 disconnects/switches off the battery from the power source that recharges the battery. In another embodiment, in response to determining that the battery is in fault state, the control module 210 raises an alarm. In such an embodiment, the control module optionally sends an instruction for providing a user interface to the graphical user interface (GUI) module 212.

The GUI module 212 includes code and routines for generating graphical data for providing a user interface. In one embodiment, the GUI module 212 includes a set of instructions executable by the processor 235 to provide the functionality for generating graphical data for providing a user interface. In another embodiment, the GUI module 212 is stored in the memory 237 and is accessible and executable by the processor 235. In either embodiment, the GUI module 212 is adapted for communication and cooperation with the processor 235 and other components of the prognosis application 201 via the bus 220.

In one embodiment, the GUI module 212 receives an instruction from the control module 210. The received instruction indicates that the battery is in fault state. The GUI module 212 then generates graphical data for providing a user interface that indicates the fault state of the battery to a user (for example, an administrator/operator) of the prognostic device. For example, the user interface displays a message such as "Warning: The battery is in fault state!" The GUI module 212 may send the graphical data to an electronic display (not pictured) for rendering the user interface. In another example, the GUI module 212 sends the graphical data as an e-mail to a user.

Although, the prognosis application 201 is described with reference to determining a number of functional cells ($N_{F\text{-}cells}$) in the battery, in one embodiment where the battery includes a string configuration, the prognosis application 201 may determine the number of functional cells ($N_{F\text{-}cells}$) from each of the one or more groups (i.e., strings) of cells. In such an embodiment, for example, the communication module 202 receives the characteristics (i.e., terminal voltage, terminal current, or the like) of a group of cells in the battery. The direction module 204 identifies changes in the excitation direction of the group of cells. The resistance module 206 calculates the discharge resistance and the recharge resistance of the group of cells. The determination module 208 determines the number of functional ($N_{F\text{-}cells}$) from the group of cells, for example, based on equation 3. In such an example, the determination module 208 determines the open circuit voltage of the group of cells based on initial number of cells ($N_{I\text{-}cells}$) in the group and the open circuit voltage of each cell in the group. In another example, the determination module 208 determines the number of functional cells ($N_{F\text{-}cells}$) based on the recharge and discharge resistances. The control module 210 modifies the initial number of cells ($N_{I\text{-}cells}$) in the group. For example, the control module 210 modifies (i.e., replaces) the initial number of cells ($N_{I\text{-}cells}$) stored in the memory 237 with the determined number of functional cells ($N_{F\text{-}cells}$). The control module 210 also determines whether the group of cells is in fault state and disconnects the group of cells.

Figure 4:
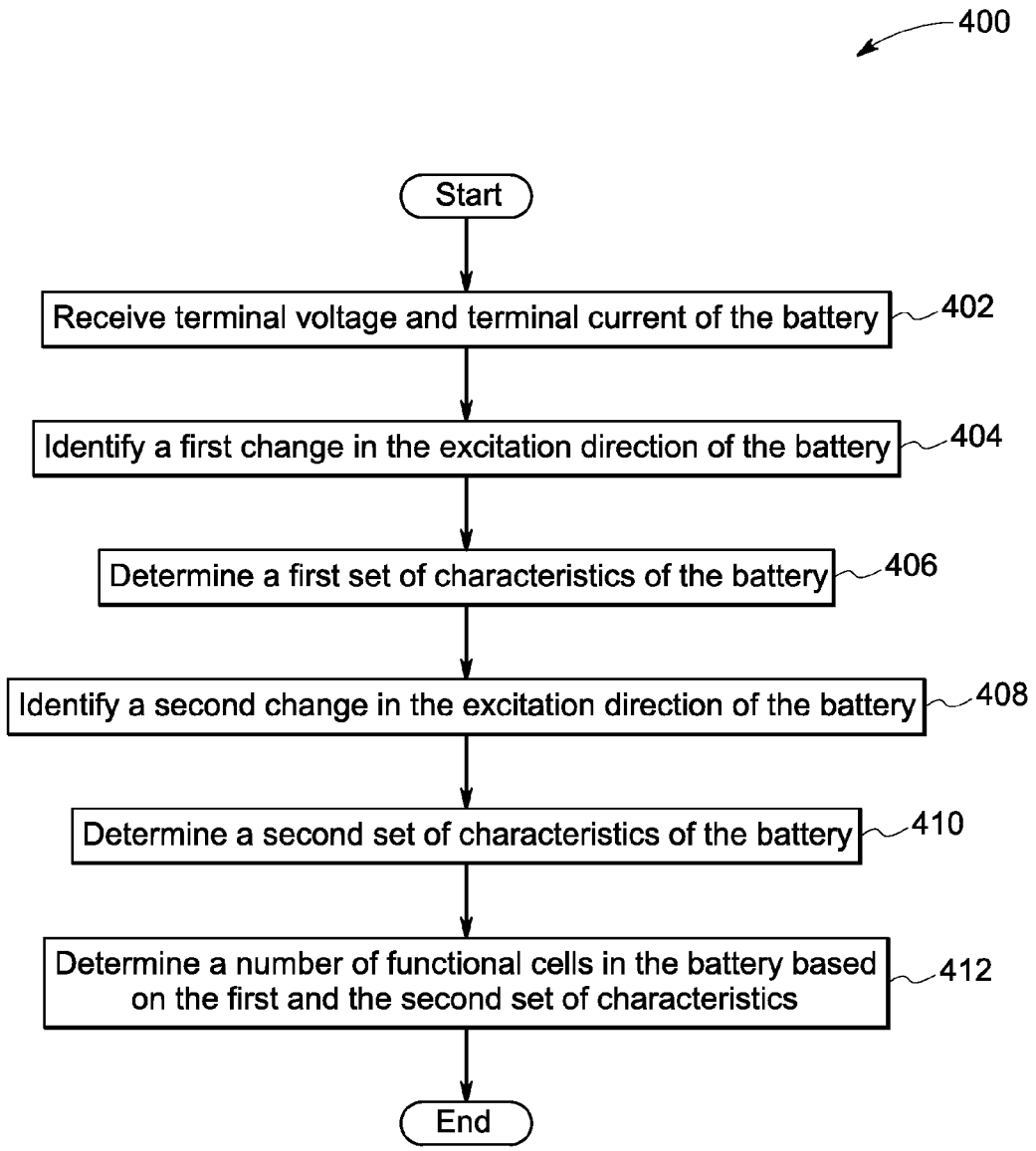
FIG. 4 is a flow diagram illustrating a method for determining a number of functional cells in a battery according to one embodiment.

FIG. 4 is a flow diagram illustrating an exemplary method 400 for determining a number of functional cells ($N_{F\text{-}cells}$) in a battery. The communication module receives 402 the measured terminal voltage and the terminal current of the battery. For example, the communication module receives the measured terminal voltage and the terminal current from the monitoring device. The direction module identifies 404 a first change in the excitation direction of the battery. For example, the direction module identifies the first change in the excitation direction by determining that the battery transitioned from the discharge cycle to the recharge cycle based on the received terminal current. The direction module determines 406 a first set of characteristics of the battery. In the above example, the direction module determines the received terminal current and terminal voltage corresponding to the first change as the first set of characteristics.

The direction module identifies 408 a second change in the excitation direction of the battery 105. In the above example, the direction module identifies the second change by determining that the battery transitioned from the recharge cycle to the discharge cycle based on the received terminal current. The direction module determines 410 a first set of characteristics of the battery. In the above example, the direction module determines the received terminal current and terminal voltage corresponding to the second change as the second set of characteristics. The determination module determines 412 a number of functional cells ($N_{F\text{-}cells}$) in the battery based on the first and the second set of characteristics 412. For example, the determination module determines the number of functional cells ($N_{F\text{-}cells}$) based on equation (3).

Figure 5:
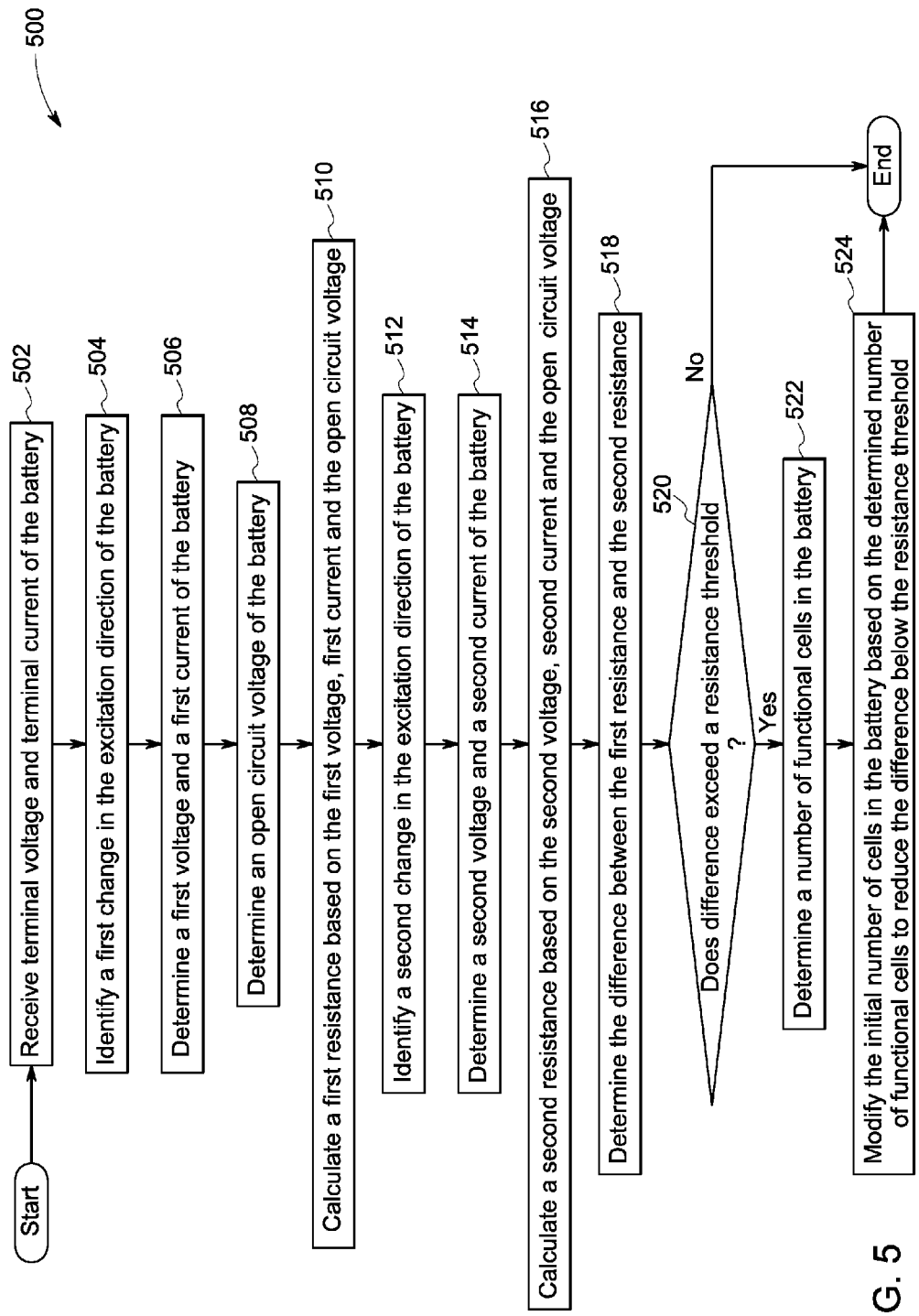
FIG. 5 is a flow diagram illustrating a method for determining a number of functional cells in a battery according to another embodiment.

FIG. 5 is a flow diagram illustrating another exemplary method 500 for determining a number of functional cells ($N_{F\text{-}cells}$) in a battery. The communication module receives 502 the terminal voltage and the terminal current of the battery. The direction module identifies 504 a first change in the excitation direction of the battery. For example, the direction module identifies the first change by determining that the battery transitioned from the discharge cycle to the recharge cycle based on the received terminal current. The direction module determines 506 a first voltage and a first current of the battery. In the above example, the direction module determines the received terminal current and terminal voltage corresponding to the first change, as the first voltage and the first current respectively.

The resistance module determines 508 an open circuit voltage of the battery. For example, the resistance module determines the open circuit voltage of the battery based on the initial number of cells ($N_{I\text{-}cells}$) in the battery and the open circuit voltage of each cell in the battery. The resistance module determines 510 the first resistance of the battery based on the first voltage, first current and the open circuit voltage of the battery. In the above example, the resistance module determines the first resistance (i.e., recharge resistance) of the battery based on equation (2).

The direction module identifies 512 a second change in the excitation direction of the battery. In the above example, the direction module identifies the second change by determining that the battery transitioned from the recharge cycle to the discharge cycle based on the received terminal current. The direction module determines 514 a second voltage and a second current of the battery. In the above example, the direction module determines the received terminal current and terminal voltage corresponding to the second change, as the second voltage and second first current respectively.

The resistance module determines 516 the second resistance of the battery based on the second voltage, second current and the open circuit voltage of the battery. In the above example, the resistance module determines the second resistance (i.e., discharge resistance) of the battery based on equation (1). The determination module determines 518 the difference between the first resistance and the second resistance. The determination module determines 520 whether the difference exceeds a resistance threshold value. The determination module retrieves the resistance threshold value from the memory.

In one embodiment, if the determination module determines that the difference is less than or equal to the resistance threshold value, the method 500 ends. In another embodiment, if the determination module determines that the difference exceeds the resistance threshold value, the determination module determines 522 a number of functional cells ($N_{F\text{-}cells}$) in the battery. For example, the determination module determines the number of functional cells ($N_{F\text{-}cells}$) in the battery based on equation (4). The control module modifies 524 the initial number of cells ($N_{I\text{-}cells}$) in the battery based on the determined number of functional cells ($N_{F\text{-}cells}$) to reduce the difference below the resistance threshold value.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method, comprising:
   measuring a terminal current and a terminal voltage of a group of cells contained in a battery, using a monitoring device;

determining an excitation direction of the group of cells based on at least one of the terminal current and the terminal voltage;

identifying a first change in the excitation direction of the group of cells;

determining a first set of characteristics of the group of cells corresponding to the first change, wherein the first set of characteristics comprises a first voltage and a first current;

identifying a second change in the excitation direction of the group of cells, wherein the second change in the excitation direction is opposite to the first change in the excitation direction;

determining a second set of characteristics of the group of cells corresponding to the second change, wherein the second set of characteristics comprises a second voltage and a second current;

determining a number of functional cells from the group of cells based on the first voltage, the first current, the second voltage and the second current;

calculating a number of non-functional cells from the group of cells, based on the determined number of functional cells; and disconnecting the battery from an associated electrical load or from a power source that recharges the battery if the number of non-functional cells is greater than a fault threshold value.

2. The method of claim 1, further comprising:

calculating a first resistance of the group of cells based on the first set of characteristics and an open circuit voltage of the group of cells; and calculating a second resistance of the group of cells based on the second set of characteristics and the open circuit voltage of the group of cells.

3. The method of claim 2, further comprising calculating a difference between the first resistance and the second resistance.

4. The method of claim 3, further comprising:

retrieving an initial number of cells in the group of cells from a memory; and modifying the initial number of cells based on the determined number of functional cells to reduce the difference below a resistance threshold value.

5. The method of claim 1, wherein the group of cells operates based on a first-in-first-out reaction principle, wherein a reaction resistance of the group of cells decreases to an offset level during the first and the second change in the excitation direction.

6. A system comprising:

at least one processor;

a direction module stored in a memory and executable by the at least one processor, the direction module for identifying a first change in an excitation direction of a group of cells, determining a first set of characteristics of the group of cells corresponding to the first change, identifying a second change in the excitation direction of the group of cells and determining a second set of characteristics of the group of cells corresponding to the second change, wherein the second change in the excitation direction is opposite to the first change in the excitation direction, wherein the first set of characteristics comprises a first voltage and a first current, and wherein the second set of characteristics comprises a second voltage and a second current; and a determination module stored in the memory and executable by the at least one processor, the determination module coupled to the direction module for determining a number of functional cells from the group of cells based on the first voltage, the first current, the second voltage, and the second current.

7. The system of claim 6, further comprising a resistance module for calculating a first resistance of the group of cells based on the first set of characteristics and an open circuit voltage of the group of cells and calculating a second resistance of the group of cells based on the second set of characteristics and the open circuit voltage of the group of cells.

8. The system of claim 7, wherein the determination module further calculates a difference between the first resistance and the second resistance.

9. The system of claim 8, further comprising a control module for retrieving an initial number of cells in the group of cells from a memory and modifying the initial number of cells based on the determined number of functional cells to reduce the difference below a resistance threshold value.

10. The system of claim 6, further comprising a monitoring device communicatively coupled to the at least one processor, wherein the monitoring device is configured to measure a terminal current and a terminal voltage of the group of cells.

11. The system of claim 10, wherein the direction module further determines the excitation direction of the group of cells based on at least one of the terminal current and the terminal voltage.

12. A computer program product comprising a non-transitory computer readable medium encoding instructions that, in response to execution by at least one processor, cause the processor to perform operations comprising:

determining an excitation direction of a group of cells contained in a battery based on at least one of a measured terminal current and a measured terminal voltage received from a monitoring device;

identifying a first change in the excitation direction of the group of cells;

determining a first set of characteristics of the group of cells corresponding to the first change, wherein the first set of characteristics comprises a first voltage and a first current;

identifying a second change in the excitation direction of the group of cells, wherein the second change in the excitation direction is opposite to the first change in the excitation direction;

determining a second set of characteristics of the group of cells corresponding to the second change, wherein the second set of characteristics comprises a second voltage and a second current;

determining a number of functional cells from the group of cells based on the first voltage, the first current, the second voltage, and the second current;

calculating a number of non-functional cells from the group of cells, based on the determined number of functional cells; and disconnecting the battery from an associated electrical load or from a power source that recharges the battery if the number of non-functional cells is greater than a fault threshold value.

13. The computer program product of claim 12, further causing the processor to perform operations comprising:

calculating a first resistance of the group of cells based on the first set of characteristics and an open circuit voltage of the group of cells; and calculating a second resistance of the group of cells based on the second set of characteristics and the open circuit voltage of the group of cells.

14. The computer program product of claim 13, further causing the processor to perform operations comprising calculating a difference between the first resistance and the second resistance.

* * * * *